(12) United States Patent
Liu

(10) Patent No.: US 11,315,973 B2
(45) Date of Patent: Apr. 26, 2022

(54) SURFACE TEXTURE RECOGNITION SENSOR, SURFACE TEXTURE RECOGNITION DEVICE AND SURFACE TEXTURE RECOGNITION METHOD THEREOF, DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventor: Zhi Liu, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 628 days.

(21) Appl. No.: 16/329,092

(22) PCT Filed: Jul. 11, 2018

(86) PCT No.: PCT/CN2018/095281
§ 371 (c)(1),
(2) Date: Feb. 27, 2019

(87) PCT Pub. No.: WO2019/062274
PCT Pub. Date: Apr. 4, 2019

(65) Prior Publication Data
US 2021/0358984 A1    Nov. 18, 2021

(30) Foreign Application Priority Data

Sep. 27, 2017   (CN) .......................... 201710887878.5

(51) Int. Cl.
*G09G 5/00* (2006.01)
*H01L 27/146* (2006.01)
*G06V 10/145* (2022.01)
*G06V 40/13* (2022.01)
*G06V 40/12* (2022.01)

(52) U.S. Cl.
CPC ...... *H01L 27/14625* (2013.01); *G06V 10/145* (2022.01); *G06V 40/1318* (2022.01);
(Continued)

(58) Field of Classification Search
CPC ............. G06K 9/00006; G06K 9/0004; G06K 9/00885; G06F 1/3231; G09G 5/00
See application file for complete search history.

(56) References Cited

U.S. PATENT DOCUMENTS 5,621,516 A    4/1997   Shinzaki et al.
6,327,376 B1 * 12/2001  Harkin ................ G06K 9/0012
                                                           382/124

(Continued)

FOREIGN PATENT DOCUMENTS

CN    101183480 A    5/2008
CN    104794466 A    7/2015
(Continued)

OTHER PUBLICATIONS

International Search Report and Written Opinion dated Oct. 12, 2018; PCT/CN2018/095281.
(Continued)

*Primary Examiner* — Kevin K Pyo

(57) ABSTRACT

A surface texture recognition sensor, a surface texture recognition device and a surface texture recognition method thereof, and a display device are disclosed. The surface texture recognition sensor is configured to recognize a ridge and a valley of a surface, and includes: a first dielectric layer and a second dielectric layer which overlap with each other; a light source which is configured to emit light into the first dielectric layer; and a photosensitive detector which is at a side of the second dielectric layer away from the first dielectric layer. The light emitted from the light source is incident onto the interface with an incident angle; with the
(Continued)

recognition unit being in contact with the surface, refractive index of at least one of the first dielectric layer and the second dielectric layer is changed to allow a critical angle of total reflection to be changed.

15 Claims, 3 Drawing Sheets

(52) U.S. Cl.
CPC ...... *G06V 40/1359* (2022.01); *H01L 27/1462* (2013.01); *H01L 27/1464* (2013.01); *H01L 27/14623* (2013.01); *H01L 27/14665* (2013.01); *H01L 27/14669* (2013.01)

(56) References Cited

U.S. PATENT DOCUMENTS

| | | | | |
|---|---|---|---|---|
| 2009/0102808 A1* | 4/2009 | Huang | ............... | G06F 3/0445 345/173 |
| 2017/0147855 A1 | 5/2017 | Wu | | |
| 2018/0121701 A1 | 5/2018 | Ling et al. | | |
| 2018/0211087 A1 | 7/2018 | Wang et al. | | |
| 2019/0102593 A1 | 4/2019 | Wang et al. | | |

FOREIGN PATENT DOCUMENTS

| | | |
|---|---|---|
| CN | 105844270 A | 8/2016 |
| CN | 106228144 A | 12/2016 |
| CN | 106647004 A | 5/2017 |
| CN | 106778460 A | 5/2017 |
| CN | 106934384 A | 7/2017 |
| CN | 106951817 A | 7/2017 |
| CN | 107203733 A | 9/2017 |
| CN | 107563354 A | 1/2018 |

OTHER PUBLICATIONS

The First Chinese Office Action dated Jul. 11, 2019; Appln. No. 20171088787.5.

* cited by examiner

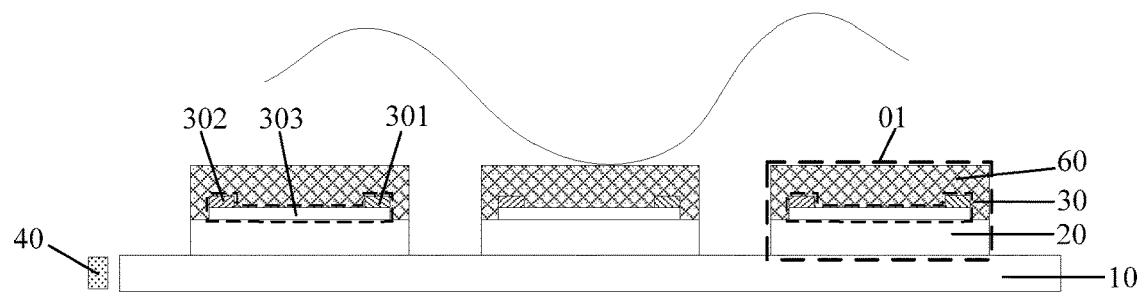

Fig. 5

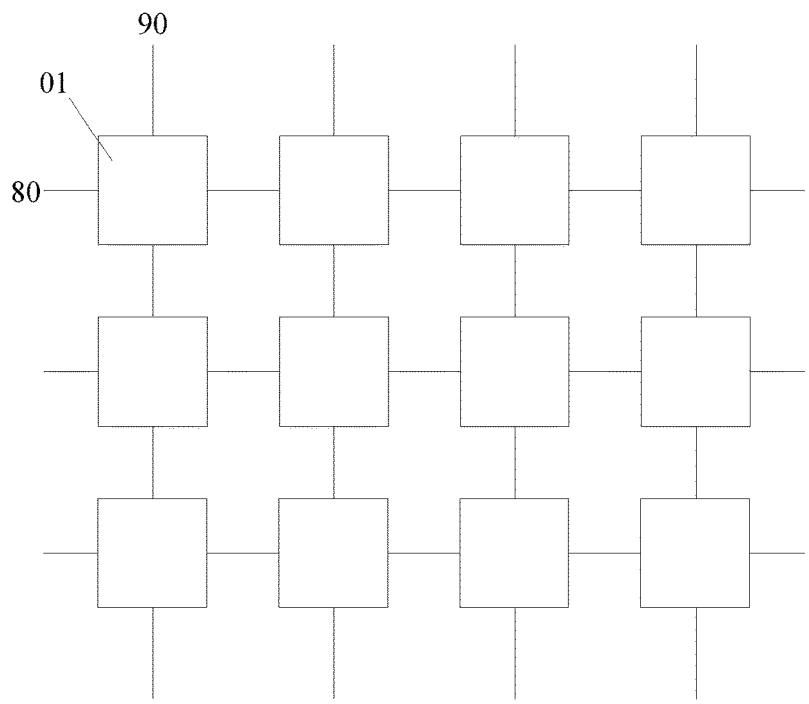

Fig. 6 determining a portion, which is corresponding to a position where a fingerprint detection unit is located, of a fingerprint to be a ridge or a valley according to whether or not light, which is emitted by a light source and detected by the detection unit, passes through the interface between a first dielectric layer and a second dielectric layer and is incident onto the detection unit, so as to obtain fingerprint information —S100

Fig. 7

SURFACE TEXTURE RECOGNITION SENSOR, SURFACE TEXTURE RECOGNITION DEVICE AND SURFACE TEXTURE RECOGNITION METHOD THEREOF, DISPLAY DEVICE

The application claims priority to Chinese patent application No. 201710887878.5, filed on Sep. 27, 2017, the entire disclosure of which is incorporated herein by reference as part of the present application.

TECHNICAL FIELD

Embodiments of the present disclosure relate to a surface texture recognition sensor, a surface texture recognition device and a surface texture recognition method thereof, and a display device.

BACKGROUND

With continuous improvement of living standards, various kinds of terminal devices have become necessities in life, and users' requirements on terminal devices are becoming higher and higher. From the perspective of safety, because fingerprints have the characteristic of uniqueness for each individual, the fingerprint recognition has excellent privacy protection capability, and therefore, the fingerprint recognition is widely applied in various terminal devices, so as to increase user experience and safety.

SUMMARY

The embodiments of the present disclosure provide a surface texture recognition sensor, which is configured to recognize a ridge and a valley of a surface, the recognition unit comprises: a first dielectric layer and a second dielectric layer which overlap with each other; a light source which is configured to emit light into the first dielectric layer; and a photosensitive detector which is at a side of the second dielectric layer away from the first dielectric layer, and is used to detect whether or not the light emitted from the light source passes through an interface between the first dielectric layer and the second dielectric layer and is incident onto the photosensitive detector; in which the light emitted from the light source is incident onto the interface with an incident angle; with the recognition unit being in contact with the surface, a refractive index of at least one of the first dielectric layer and the second dielectric layer is changed to allow a critical angle of total reflection to be changed according to one of following ways: from being smaller than the incident angle to being larger than the incident angle; and from being larger than the incident angle to being smaller than the incident angle.

In an example, with the recognition unit being in contact with the surface, changing of the refractive index of the at least one of the first dielectric layer and the second dielectric layer to allow the critical angle to be changed from the angle smaller than the incident angle to the angle larger than the incident angle comprises: with the recognition unit being in contact with the surface, the refractive index of the second dielectric layer is increased and/or the refractive index of the first dielectric layer is decreased to allow the critical angle to be changed from being smaller than the incident angle into being larger than the incident angle.

In an example, with the recognition unit being in contact with the surface, changing of the refractive index of the at least one of the first dielectric layer and the second dielectric layer to allow the critical angle to be changed from the angle larger than the incident angle into the angle smaller than the incident angle comprises: with the recognition unit being in contact with the surface, the refractive index of the second dielectric layer is decreased and/or the refractive index of the first dielectric layer is increased to allow the critical angle to be changed from the angle larger than the incident angle into the angle smaller than the incident angle.

In an example, the surface texture recognition sensor further comprises a thermal conductive layer at a side of the photosensitive detector away from the second dielectric layer; the thermal conductive layer is in contact with the first dielectric layer and/or the second dielectric layer.

In an example, the photosensitive detector comprises a switch unit; the switch unit is configured to be in a turn-on state if the switch unit is illuminated by the light emitted by the light source, and to be in a turn-off state if the switch unit is not illuminated by the light emitted by the light source.

In an example, the switch unit comprises a first electrode, a second electrode, and a semiconductor layer which is in contact with both of the first electrode and the second electrode, and the first electrode and the second electrode are insulated from each other.

In an example, the light emitted by the light source is invisible light.

In an example, the surface texture recognition sensor further comprises a light-shielding layer which covers the photosensitive detector.

In an example, a material of the thermal conductive layer is a light shielding material.

In an example, the refractive index of the at least one of the first dielectric layer and the second dielectric layer is changed along with a change in temperature.

Another embodiment of the present disclosure provides a surface texture recognition device, in which, the surface texture recognition device comprises a plurality of surface texture recognition sensors that are any one type of the above-mentioned surface texture recognition sensors.

In an example, the surface texture recognition device further comprises: a plurality of first electrode lines arranged in parallel and a plurality of second electrode lines arranged in parallel; and the plurality of first electrode lines and the plurality of second electrode lines are intersected and insulated from each other, and each of the photosensitive detectors is connected with one of the first electrode lines and with one of the second electrode lines.

In an example, the surface texture recognition device further comprises a signal input unit and a processor unit, the signal input unit which is configured to input signals to the plurality of first electrode lines, the processor unit which is configured to detect output signals on the plurality of second electrode lines which intersect the first electrode lines in a case where the first electrode lines are inputted with input signals, and to determine portions of the surface corresponding to positions of the surface texture recognition sensors to be ridges or valleys according to the output signals on the plurality of second electrode lines, so as to obtain texture information of the surface.

Further another embodiment of the present disclosure provides a display device, which comprises any one of the above-mentioned surface texture recognition devices.

Further another embodiment of the present disclosure provides a surface texture recognition method of any one of the above-mentioned the surface texture recognition devices, which comprises: determining a portion, which is corresponding to a position where each of the surface texture recognition sensors is located, of the surface to be the ridge or the valley according to whether or not light, which is emitted by the light source and detected by the photosensitive detector, passes through the interface between the first dielectric layer and the second dielectric layer and is incident onto the photosensitive detector, so as to obtain texture information of the surface.

In an example, the surface texture recognition device further comprises: a plurality of first electrode lines arranged in parallel and a plurality of second electrode lines arranged in parallel; the first electrode lines and the second electrode lines are intersected are insulated from each other, the first electrode lines and the second electrode lines are connected with the photosensitive detectors, respectively; the surface texture recognition method comprises: inputting input signals to the plurality of first electrode lines row by row; sequentially detecting output signals on the plurality of second electrode lines; determining the portion, which is corresponding to the position where each of the photosensitive detectors is located, of the surface to be the ridge or the valley according to the output signals, so as to obtain the texture information of the surface.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 5 is a schematically structural view of a surface texture recognition device provided by the embodiments of the present disclosure;

FIG. 6 is a schematically structural view of a surface texture recognition device provided by the embodiments of the present disclosure; and FIG. 7 is a schematically flow chart of a surface texture recognition method of a surface texture recognition device provided by the embodiments of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The technical solutions of the embodiments will be described in a clearly and fully understandable way in connection with the drawings related to the embodiments of the disclosure. Apparently, the described embodiments are just a part but not all of the embodiments of the disclosure. Based on the embodiments herein, those skilled in the art can obtain other embodiment(s), without any inventive work, which should be within the scope of the disclosure.

Figure 1:
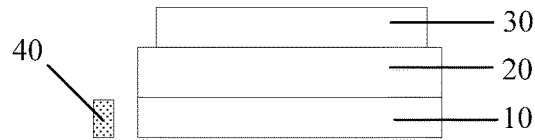
FIG. 1(a) is a schematically structural view of a surface texture recognition sensor provided by the embodiments of the present disclosure.
FIG. 1(b) is a schematically structural view of a surface texture recognition sensor provided by the embodiments of the present disclosure.
FIG. 1(c) is a schematically structural view of a surface texture recognition sensor provided by the embodiments of the present disclosure.
FIG. 1(d) is a schematically structural view of a surface texture recognition sensor provided by the embodiments of the present disclosure.
Figure 1:
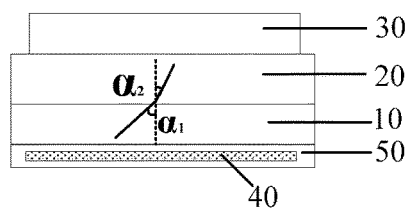
Figure 1:
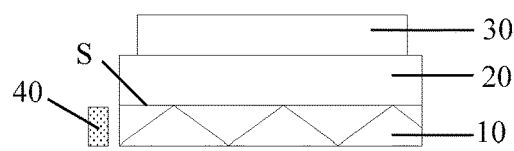
Figure 1:
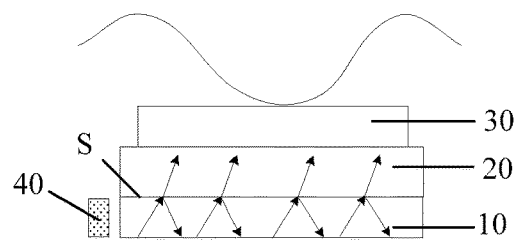

An embodiment of the present disclosure provides a surface texture recognition sensor (for example, a recognition unit for a fingerprint of a finger) 01, as illustrated in FIG. 1, which comprises: a first dielectric layer 10, a second dielectric layer 20 and a photosensitive detector 30 which are sequentially laminated; the surface texture recognition sensor 01 further comprises: a light source 40; the light emitted by the light source 40 is incident into the first dielectric layer 10. The refractive index of the first dielectric layer 10 and/or the refractive index of the second dielectric layer 20 may be changed when a fingerprint of a finger is in contact with the surface texture recognition sensor, so as to change the total reflection condition of the light emitted by the light source 40 at the interface S between the first dielectric layer 10 and the second dielectric layer 20; the photosensitive detector 30 is used to detect whether or not the light emitted by the light source 40 passes through the second dielectric layer 20 and is incident on the photosensitive detector 30.

Both of the material of the first dielectric layer 10 and the material of the second dielectric layer 20 are transparent materials. Here, transparent material refers to a material that allows the light emitted by the light source 40 to pass through. For example, for the light emitted by the light source 40, both of the transmissivity of the material of the first dielectric layer 10 and the transmissivity of the material of the second dielectric layer 20 are greater than 90%.

In the case where the finger is in contact with the recognition unit for the fingerprint of the finger, the thermal energy of the ridge(s) of the fingerprint of the finger can be conducted to the first dielectric layer 10 and/or the second dielectric layer 20, this allows the temperature of the first dielectric layer 10 and/or the temperature of the second dielectric layer 20 to be changed, so as to allow the refractive index of the first dielectric layer 10 and/or the refractive index of the second dielectric layer 20 to be changed. Here, it may be the case where the refractive index of the first dielectric layer 10 is changed when the fingerprint of the finger is in contact with the recognition unit; it may also be the case where the refractive index of the second dielectric layer 20 is changed when the fingerprint of the finger is in contact with the recognition unit; of course, it may also be the case where both of the refractive index of the first dielectric layer 10 and the refractive index of the second dielectric layer 20 are changed when the fingerprint of the finger is in contact with the recognition unit.

Surface texture involved in the embodiments of the present disclosure is not limited to the fingerprint of a finger; other kinds of fingerprint such as the fingerprint of a toe, the palmprint of a palm, and the like fall within the protection scope of the embodiments of the present disclosure.

On this basis, the refractive index of the first dielectric layer 10 and/or the refractive index of the second dielectric layer 20 may be changed in the case where the fingerprint is in contact with the recognition unit; for the rule of refractive index change, it may be the case where the refractive index is increased along with an increase in temperature, and in this case, the material of the dielectric layer, for example, may be silicon nanocrystalline (nc-Si), and silicon nanocrystalline is a kind of nano-electronic material formed of a large number of fine silicon grains and grain boundaries which surround the grains; it may also be the case where the refractive index is decreased along with an increase in temperature, and in this case, the material of the dielectric layer, for example, may be glass. The principle that the refractive index changes along with the temperature is described by taking the case where the refractive index is increased along with an increase in temperature as an example, the increase in the temperature allows electron energy to be increased, this increases the probability of electron transition and raises the degree of the polarization which is generated by the electrical filed applied due to light, of a dielectric, and the rise of the degree of the polarization acts as an increase in refractive index of the material.

No specific limitation will be given to the types of the light source 40, which may be a point light source, a line light source or a surface light source.

In addition, no specific limitation will be given to the arrangement position of the light source 40, the light source 40 may be arranged, as illustrated in FIG. 1(*a*), at a side surface of the first dielectric layer 10; the light source 40 may also be arranged, as illustrated in FIG. 1(*b*), at the side of the first dielectric layer 10 away from the second dielectric layer 20, and to emit light toward the first dielectric layer 10. In the case where the light source 40 is arranged at the side of the first dielectric layer 10 away from the second dielectric layer 20, in order to guarantee the total reflection of the light which is emitted by the light source 40 and is incident into the first dielectric layer 10 be able to occur at the interface S between the first dielectric layer 10 and the second dielectric layer 20, as illustrated in FIG. 1(*b*), the light source 40 may be arranged in a third dielectric layer 50, the refractive index of the third dielectric layer 50 is greater than the refractive index of the second dielectric layer 20. On this basis, in the case where the light source 40 is arranged at the side of the first dielectric layer 10 away from the second dielectric layer 20, in order to guarantee the total reflection of the light which is emitted by the light source 40 and is incident into the first dielectric layer 10 be able to occur at the interface S between the first dielectric layer 10 and the second dielectric layer 20 after the light emitted by the light source 40 is incident into the first dielectric layer 10, the light emitted by the light source 40 is not perpendicularly incident into the first dielectric layer 10. In the case where the light source 40 is arranged at the side surface of the first dielectric layer 10, the light source 40 may be arranged at one side surface, or two side surfaces, or three side surfaces, or four side surfaces of the first dielectric layer 10, no specific limitation will be given in this respect.

In the embodiments of the present disclosure, in the case where the fingerprint of the finger is in contact with the surface texture recognition sensor 01 (the fingerprint of the finger being in contact with the surface texture recognition sensor 01 refers to that the ridges of the fingerprint of the finger are in contact with the surface texture recognition sensor 01 while the valleys of the fingerprint of the finger are not in contact with the surface texture recognition sensor 01 when the fingerprint of the finger is in contact with the surface texture recognition sensor 01), the total reflection condition of the light emitted by the light source 40 at the interface S between the first dielectric layer 10 and the second dielectric layer 20 is changed; after the light emitted by the light source 40 is incident into the first dielectric layer 10, the light emitted by the light source 40 has two states: occurring of total reflection at the interface S between the first dielectric layer 10 and the second dielectric layer 20, and occurring of refraction and reflection at the interface S between the first dielectric layer 10 and the second dielectric layer 20.

On this basis, the propagation of the light emitted by the light source 40 provided by an embodiment of the present disclosure in the first dielectric layer 10 has the following two states.

First state: as illustrated in FIG. 1(*c*), in the case where the fingerprint of the finger is not in contact with the surface texture recognition sensor 01, after the light emitted by the light source 40 is incident into the first dielectric layer 10, the total reflection occurs at the interface S between the first dielectric layer 10 and the second dielectric layer 20; as illustrated in FIG. 1(*d*), in the case where the fingerprint of the finger is in contact with the surface texture recognition sensor 01, the refractive index of the position, which is corresponding to the ridge of the fingerprint of the finger, of the second dielectric layer 20 is increased and/or the refractive index of the position, which is corresponding to the ridge of the fingerprint of the finger, of the first dielectric layer 10 is decreased, and therefore the refraction and the reflection of the light emitted by the light source 40 occur at the position, which is corresponding to the ridge of the fingerprint of the finger, of the interface S between the first dielectric layer 10 and the second dielectric layer 20.

Here, when the fingerprint of the finger is in contact with the surface texture recognition sensor 01, it may be the case where the refractive index of the first dielectric layer 10 is decreased; it may also be the case where the refractive index of the second dielectric layer 20 is increased; of course, it may also be the case where the refractive index of the first dielectric layer 10 is decreased while the refractive index of the second dielectric layer 20 is increased.

The principle is described in the following: refer to FIG. 1(*b*), according to the refractive index equation: $n1 \times \sin \alpha1 = n2 \times \sin \alpha2$, in which n1 is the refractive index of the first dielectric layer 10, n2 is the refractive index of the second dielectric layer 20, $\alpha1$ is an incident angle, and $\alpha2$ is an refraction angle. In the case where the total reflection of the light occurs at the interface between the first dielectric layer 10 and the second dielectric layer 20, $\alpha2=90°$, and $n1 \times \sin \alpha1 \geq n2$; in the case where the ridge of the fingerprint of the finger is in contact with the surface texture recognition sensor 01, because the thermal energy of the ridge of the fingerprint of the finger can be conducted to the first dielectric layer 10 and/or the second dielectric layer 20, the refractive index of the first dielectric layer 10 is decreased and/or the refractive index n2 of the second dielectric layer 20 is increased, $n1 \times \sin \alpha1 < n2$, the total reflection condition is not satisfied, and therefore, after the light emitted by the light source 40 is incident into the first dielectric layer 10, the refraction and the reflection of the light emitted by the light source 40 occur at the position, which is corresponding to the ridge of the fingerprint of the finger, of the interface between the first dielectric layer 10 and the second dielectric layer 20. It should be noted that, in the case where the temperature of the ridge of the fingerprint is greater than the temperature of the valley of the fingerprint (that is, ambient temperature), if the refractive index n2 of the second dielectric layer 20 is increased when the ridge of the fingerprint is in contact with the surface texture recognition sensor, the refractive index of the chosen material for the second dielectric layer 20 is increased along with an increase in temperature; if the refractive index n1 of the first dielectric layer 10 is decreased when the ridge of the fingerprint is in contact with the surface texture recognition sensor, the refractive index of the chosen material for the first dielectric layer 10 is decreased along with an increase in temperature. In the case where the temperature of the ridge of the fingerprint is lower than the temperature of the valley of the fingerprint, the reverse situations are true, and no further description will be given here.

In another case, in the case where the fingerprint of the finger is not in contact with the surface texture recognition sensor, after the light emitted by the light source 40 is incident into the first dielectric layer 10, the reflection and refraction of the light which is emitted by the light source 40 and is incident into the first dielectric layer 10 occurs at the interface between the first dielectric layer 10 and the second dielectric layer 20; in the case where the fingerprint of the finger is in contact with the surface texture recognition sensor, the refractive index of the second dielectric layer 20 is decreased and/or the refractive index of the first dielectric layer 10 is increased, the total reflection of the light emitted by the light source 40 occurs at the interface between the first dielectric layer 10 and the second dielectric layer 20.

Here, when the fingerprint of the finger is in contact with the surface texture recognition sensor 01, it may be the case where the refractive index of the first dielectric layer 10 is increased; it may also be the case where the refractive index of the second dielectric layer 20 is decreased; of course, it may also be the case where the refractive index of the first dielectric layer 10 is increased, and the refractive index of the second dielectric layer 20 is decreased.

The principle is described in the following, refer to FIG. 1(b), according to the refractive index equation: n1×sin α1=n2×sin α2, the critical angle of the total reflection of the light in the first dielectric layer 10 is $$\arcsin\left(\frac{n2}{n1}\right),$$

because the reflection and refraction of the light which is emitted by the light source 40 and is incident into the first dielectric layer 10 occurs at the interface between the first dielectric layer 10 and the second dielectric layer 20 after the light emitted by the light source 40 is incident into the first dielectric layer 10, the incident angle α1 is smaller than the critical angle, that is, $$\alpha 1 \leq \arcsin\left(\frac{n2}{n1}\right),$$

in the case where the fingerprint of the finger is in contact with the surface texture recognition sensor 01, because the thermal energy of the ridge of the fingerprint of the finger can be conducted to the first dielectric layer 10 and/or the second dielectric layer 20, the refractive index n1 of the first dielectric layer 10 is increased and/or the refractive index n2 of the second dielectric layer 20 is decreased, the total reflection condition is satisfied when $$\alpha 1 \geq \arcsin\left(\frac{n2}{n1}\right),$$

and therefore, the total reflection of the light emitted by the light source 40 occurs at the position, which is corresponding to the ridge of the fingerprint of the finger, of the interface between the first dielectric layer 10 and the second dielectric layer 20.

It should be noted that, in the case where the temperature of the ridge of the fingerprint is greater than the temperature of the valley of the fingerprint (that is, ambient temperature), if the refractive index n2 of the second dielectric layer 20 is decreased when the ridge of the fingerprint is in contact with the surface texture recognition sensor, the refractive index of the chosen material for the second dielectric layer 20 is decreased along with an increase in temperature; if the refractive index n1 of the first dielectric layer 10 is increased when the ridge of the fingerprint is in contact with the surface texture recognition sensor, the refractive index of the chosen material for the first dielectric layer 10 is increased along with an increase in temperature. In the case where the temperature of the ridge of the fingerprint is lower than the temperature of the valley of the fingerprint, the reverse situations are true, and no further description will be given here.

In the first arrangement way of the light source 40, in the case where the fingerprint of the finger is not in contact with the surface texture recognition sensor 01, because the total reflection of the light which is emitted by the light source 40 and is incident into the first dielectric layer 10 occurs at the interface between the first dielectric layer 10 and the second dielectric layer 20 after the light emitted by the light source 40 is incident into the first dielectric layer 10, the light emitted by the light source 40 cannot pass through the second dielectric layer 20, and cannot illuminate on the photosensitive detector 30, the photosensitive detector 30 detects no light illumination; in the case where the ridge of the fingerprint of the finger is in contact with the surface texture recognition sensor 01, the refractive index of the second dielectric layer 20 is increased and/or the refractive index of the first dielectric layer 10 is decreased, the reflection and refraction of the light which is emitted by the light source 40 and is incident into the first dielectric layer 10 occurs at the interface between the first dielectric layer 10 and the second dielectric layer 20 after the light emitted by the light source 40 is incident into the first dielectric layer 10, the light emitted by the light source 40 can pass through the second dielectric layer 20 and can illuminate on the photosensitive detector 30, the photosensitive detector 30 can detect light illumination, and therefore the ridge and the valley of the fingerprint can be determined according to whether or not the photosensitive detector 30 detects light.

In the second arrangement way of the light source 40, the photosensitive detector 30 can determine, for similar reasons, the ridge and the valley of the fingerprint according to whether or not light is detected, the determination method is similar to the determination method in the first arrangement way of the light source 40, and no further description will be given here.

Base on the above descriptions, no matter in the first arrangement way of the light source 40 or in the second arrangement way of the light source 40, in the case where the finger touches the surface texture recognition sensor 01, the ridge of the fingerprint of the finger can cause the change of the detection result of the photosensitive detector 30 (the change from the detection result that light illumination is detected to the detection result that no light illumination is detected, or the change from the detection result that no light illumination is detected to the detection result that light illumination is detected), if the detection result of the photosensitive detector 30 is changed, it may be determined that the position where the surface texture recognition sensor 01 is located is corresponding to the ridge of the fingerprint; because the valley of the fingerprint of the finger may not transfer thermal energy to the second dielectric layer 20 and/the first dielectric layer 10, the change of the refractive index of the position, which is corresponding to the valley of the fingerprint of the finger, of the first dielectric layer 10 and/or the second dielectric layer 20 may not be caused, and if the detection result of the photosensitive detector 30 is not changed (for example, the detection result always shows that light illumination is detected or that light illumination is not detected), it can be determined that the position where the surface texture recognition sensor 01 is located is corresponding to the valley of the fingerprint.

No specific limitation will be given to the types of the photosensitive detector 30, as long as it can be detected whether or not light illumination exists. The photosensitive detector 30, for example, may be a photosensitive transistor.

In the embodiments of the present disclosure, the incident angle α1 may be a specific angle, and may also be of an angle range. In the case where the incident angle α1 represents an angle range, after at least one of the refractive index of the first dielectric layer 10 and the refractive index of the second dielectric layer 20 is changed to allow the critical angle of total reflection at the interface between the first dielectric layer 10 and the second dielectric layer 20 to be changed, for example, both of the maximum angle and the minimum angle in the incident angle range become smaller than the changed critical angle or become greater than the changed critical angle.

The embodiments of the present disclosure provide a surface texture recognition sensor 01, in the case where the finger is in contact with the surface texture recognition sensor 01, the thermal energy of the ridge of the fingerprint of the finger can be conducted to the first dielectric layer 10 and/or the second dielectric layer 20, and can cause the change of the refractive index of the first dielectric layer 10 and/or the refractive index of the second dielectric layer 20, and the change of the refractive index of the first dielectric layer 10 and/or the refractive index of the second dielectric layer 20 can cause the total reflection condition of the light emitted by the light source 40 at the interface between the first dielectric layer 10 and the second dielectric layer 20 to be changed, and further cause the detection result of the photosensitive detector 30 to be changed (light illumination is not detected before the touching of the finger and light illumination is detected after the touching of the fingerprint of the finger, or light illumination is detected before the touching of the finger and light illumination is not detected after the touching of the fingerprint of the finger). Because the valley of the fingerprint of the finger is not in contact with the surface texture recognition sensor 01, the change of the refractive index of the position, which is corresponding to the valley of the fingerprint of the finger, of the first dielectric layer 10 and/or the second dielectric layer 20 is not caused, the total reflection condition of the light at the position, which is corresponding to the valley of the fingerprint of the finger, of the interface between the first dielectric layer 10 and the second dielectric layer 20 does not change, and therefore, the detection result of the photosensitive detector 30 does not change. It can be determined that the position where the surface texture recognition sensor 01 is located is corresponding to the ridge of the fingerprint or corresponding to the valley of the fingerprint according to the detection result of the photosensitive detector 30, and fingerprint information can be obtained through detection of the plurality of surface texture recognition sensors 01, such that fingerprint recognition is realized.

Figure 2:
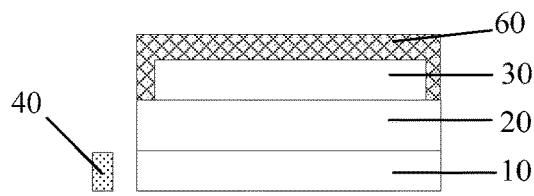
FIG. 2(a) is a schematically structural view of a surface texture recognition sensor provided by the embodiments of the present disclosure.
FIG. 2(b) is a schematically structural view of a surface texture recognition sensor provided by the embodiments of the present disclosure.
Figure 2:
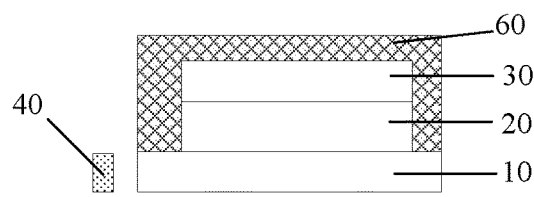

Optionally, as illustrated in FIG. 2(*a*) and FIG. 2(*b*), the surface texture recognition sensor 01 further comprises a thermal conductive layer 60 at the side of the photosensitive detector 30 away from the second dielectric layer 20; the thermal conductive layer 60 is in contact with the first dielectric layer 10 and/or the second dielectric layer 20.

The material of the thermal conductive layer 60 can conduct heat.

Here, the thermal conductive layer 60 may be, as illustrated in FIG. 2(*a*), only in contact with the second dielectric layer 20; the thermal conductive layer 60 may also be, as illustrated in FIG. 2(*b*), in contact with both of the first dielectric layer 10 and the second dielectric layer 20; of course, the thermal conductive layer 60 may be only in contact with the first dielectric layer 10 (not illustrated in the accompany drawings of the embodiments of the present disclosure). Because the distance between the second dielectric layer 20 and the thermal conductive layer 60 is relatively smaller, in some embodiments of the present disclosure, the second dielectric layer 20 is in contact with the thermal conductive layer 60.

In the embodiments of the present disclosure, because the thermal conductive layer 60 can conduct heat, in the case where the finger is in contact with the surface texture recognition sensor 01, the thermal energy of the ridge of the fingerprint of the finger can be conducted to the dielectric layer which is in contact with the thermal conductive layer 60 through the thermal conductive layer 60, and therefore, the disposing of the thermal conductive layer 60 can increase the fingerprint recognition accuracy of the surface texture recognition sensor.

Optionally, the photosensitive detector 30 comprises a switch unit, the switch unit is configured to be in a turn-on state if the switch unit is illuminated by the light emitted by the light source 40, and to be in a turn-off state if the switch unit is not illuminated by the light emitted by the light source 40.

No specific limitation is given to specific structure of the switch unit, as long as the switch unit is able to be in a turn-on state when the switch unit is illuminated by light, and is able to be in a turn-off state when the switch unit is not illuminated by the light. The light here refers to the light emitted by the light source 40.

In the case where the photosensitive detector 30 comprises the switch unit, the detection processes of the photosensitive detector 30 may be described in the following. If the switch unit is in a turn-on state, it can be concluded that the light emitted by the light source 40 is incident on the switch unit to allow the switch unit to be in a turn-on state; if the switch unit is in a turn-off state, it can be concluded that the light emitted by the light source 40 is not incident on the switch unit. According to the state of the switch unit, it can be determined that whether or not the light emitted by the light source 40 passes through the second dielectric layer 20 and is incident onto the photosensitive detector 30.

Figure 3:
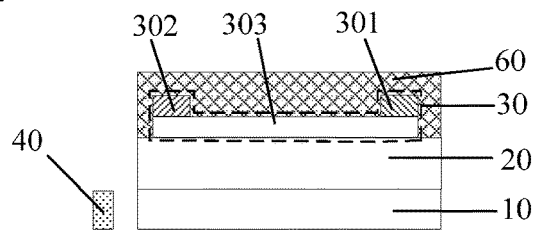
FIG. 3 is a schematically structural view of a surface texture recognition sensor provided by the embodiments of the present disclosure.

Optionally, as illustrated in FIG. 3, the switch unit comprises a first electrode 301, a second electrode 302, and a semiconductor layer 303 which is in contact with both of the first electrode 301 and the second electrode 302. The first electrode 301 and the second electrode 302 are, for example, insulated from each other.

No specific limitation will be given to the material of the first electrode 301 and the second electrode 302, for example, the material of the first electrode 301 and the second electrode 302 may be metallic elementary substance such as Mg (Magnesium), Al (Aluminum), Cu (Copper), alloy or metal oxides such as ITO (Indium tin oxide), IZO (Indium Zinc Oxide), or the like. In addition, the material of the first electrode 301 and the material of the second electrode 302 may be the same, and may also be different. In an embodiment of the present disclosure, the first electrode 301 and the second electrode 302 are in the same layer and manufactured from the same material. By this way, the first electrode 301 and the second electrode 302 may be formed simultaneously in one pattering process, and therefore, the manufacturing processes of the surface texture recognition device is simplified.

Here, the material of the semiconductor layer 303 may be converted from a semiconductor into a conductor under light illumination. On this basis, it may be the case where the semiconductor layer 303 is converted from a semiconductor into a conductor under the illumination of visible light; it may also be the case where the semiconductor layer 303 is converted from a semiconductor into a conductor under the illumination of ultraviolet light or infrared light.

On this basis, no specific limitation will be given to the arrangement positions of the first electrode 301, the second electrode 302 and the semiconductor layer 303 in the switch unit, it may be the case where the first electrode 301, the second electrode 302 and the semiconductor layer 303 are arranged in the same layer; it may also be the case where the first electrode 301 and the second electrode 302 are arranged to be laminated with the semiconductor layer 303. In order to decrease the area of the orthographic projection of the surface texture recognition sensor 01 on the first dielectric layer 10 such that more surface texture recognition sensors 01 can be arranged, in an embodiment of the present disclosure, the semiconductor layer 303 is arranged to be laminated with the first electrode 301 and the second electrode 302, in this case, it may be the case where the semiconductor layer 303 is closer to the second dielectric layer 20, it may also be the case where the first electrode 301 and the second electrode 302 are closer to the second dielectric layer 20; in order to allow more of the light emitted by the light source 40 to be able to be incident on the semiconductor layer 303, in an embodiment of the present disclosure, the semiconductor layer 303 is closer to the second dielectric layer 20.

In the embodiments of the present disclosure, the switch unit comprises the first electrode 301, the second electrode 302, and the semiconductor layer 303 which is in contact with both of the first electrode 301 and the second electrode 302, the semiconductor layer 303 is converted from a semiconductor into a conductor when illuminated by light, and allows the first electrode 301 and the second electrode 302 electrically connected, and by this way, the switch unit is in a turn-on state.

The photosensitive detector 30 in the embodiments of the present disclosure is used to detect whether or not the light emitted by the light source 40 passes through the interface between the first dielectric layer 10 and the second dielectric layer 20 and is incident on the photosensitive detector 30; in order to prevent ambient light from illuminating on the photosensitive detector 30 and prevent ambient light from affecting the detection result, the embodiments of the present disclosure further provide the following optional implementation ways.

For example, the photosensitive detector 30 is used to detect whether or not light with specific wavelength is incident on the photosensitive detector 30, the light source 40 is used to emit the light with specific wavelength; the light with specific wavelength is invisible light.

The invisible light, for example, may be ultraviolet light or infrared light. In the case where the light emitted by the light source 40 is ultraviolet light, the material of the photosensitive detector 30, for example, may comprises cadmium sulfide, cadmium selenide, or the like, and in this case, the photosensitive detector 30 can only detect ultraviolet light; in the case where the light emitted by the light source 40 is infrared light, the material of the photosensitive detector 30, for example, may comprise lead sulfide, lead telluride, lead selenide, indium telluride, or the like, and in this case, the photosensitive detector 30 can only detect infrared light.

It should be noted that, even though invisible light such as infrared light or ultraviolet light exists in the ambient light, because the quantity of the invisible light is small and the photosensitive detector 30 is unable to detect the invisible light in the ambient light, the invisible light in the ambient light can be ignored.

On this basis, because the light emitted by the light source 40 is invisible light, and the photosensitive detector 30 can only detect the invisible light, the ambient light in the environment is unable to be detected by the photosensitive detector 30, and thus the fingerprint recognition accuracy is guaranteed.

Figure 4:
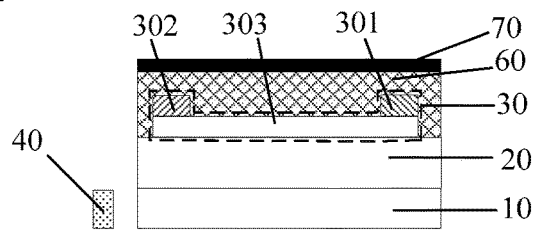
FIG. 4 is a schematically structural view of a surface texture recognition sensor provided by the embodiments of the present disclosure.

In another example, as illustrated in FIG. 4, the surface texture recognition sensor 01 further comprises a light-shielding layer 70 which covers the photosensitive detector 30.

No specific limitation will be given to the material of the light-shielding layer 70, as long as the light-shielding layer 70 is able to shield light. The material of the light-shielding layer 70, for example, may adopt black resin or graphite, and so on.

In another example, in the case where the surface texture recognition sensor 01 further comprises the thermal conductive layer 60, the material of the thermal conductive layer 60 is a light shielding material.

Here, in the case where the material of the thermal conductive layer 60 is the light shielding material, the thermal conductive layer 60 may adopt the material same as the material of the above-mentioned light-shielding layer 70, and no further description will be given here.

In the embodiments of the present disclosure, in the case where the surface texture recognition sensor 01 further comprises the light-shielding layer 70 which covers the photosensitive detector 30 or the material of the thermal conductive layer 60 is the light shielding material, because the light-shielding layer 70 or the light shielding material can prevent the ambient light from illuminating on the photosensitive detector 30 so as to prevent the ambient light from outside from affecting the detection result of the photosensitive detector 30, the fingerprint recognition accuracy is guaranteed.

In the case where the light emitted by the light source 40 is non-collimated light, by taking the case where the total reflection of the light emitted by the light source 40 occurs at the interface between the first dielectric layer 10 and the second dielectric layer 20 when the finger is not in contact with the surface texture recognition sensor 01 as an example, in order to guarantee that the total reflection at the interface between the first dielectric layer 10 and the second dielectric layer 20 occurs for all the light emitted by the light source 40, it is necessary to guarantee that the light, at the minimum incident angle, in the non-collimated light emitted by the light source 40 is able to be total-reflected at the interface between the first dielectric layer 10 and the second dielectric layer 20. by this way, the total reflection of all the non-collimated light can occur in the first dielectric layer 10; further in the case where the finger is in contact with the surface texture recognition sensor 01, if the increase of the refractive index of the second dielectric layer 20 is not large enough when the refractive index of the second dielectric layer 20 increases, total reflection may occur for part of light in the non-collimated light, refraction and reflection may occur for part of light in the non-collimated light, and this may cause the fingerprint recognition effect of the surface texture recognition device not good.

On this basis, in some embodiments of the present disclosure, the light source 40 is configured to emit collimated light.

The light source 40 in an embodiment of the present disclosure is used to emit collimated light, by this way, compared with the case where the light source 40 emits non-collimated light, all the collimated light emitted by the light source 40 can be controlled more easily to be total-reflected at the interface between the first dielectric layer 10 and the second dielectric layer 20; or, all the collimated light emitted by the light source 40 is refracted and reflected at the interface between the first dielectric layer 10 and the second dielectric layer 20.

An embodiment of the present disclosure provides a surface texture recognition device, as illustrated in FIG. 5, the surface texture recognition device comprises a plurality of above-mentioned surface texture recognition sensors 01.

The surface texture recognition device may comprise a plurality of surface texture recognition sensors 01 which are independent and district from each other, in the case where the refractive index of the first dielectric layers 10 in the surface texture recognition sensors 01 are not changed when the surface texture recognition sensors 01 are touched, the first dielectric layers 10 in the plurality of surface texture recognition sensors 01, may be, as illustrated in FIG. 5, connected with each other. In addition, in the case where the surface texture recognition sensor 01 comprises the light-shielding layer 70, the light-shielding layers 70 in the surface texture recognition sensors 01 may be connected or may also be separated, and no specific limitation will be given in this respect.

The embodiment of the present disclosure provide the surface texture recognition device, in the case where the finger touches the surface texture recognition device, because each of the surface texture recognition sensors 01 in the surface texture recognition device can detect the portion, which is corresponding to the position where the surface texture recognition sensor 01 is located, of the fingerprint to be the ridge or the valley of the fingerprint, the fingerprint information can be obtained through detection of the plurality of surface texture recognition sensors 01, such that the fingerprint recognition is realized.

For example, as illustrated in FIG. 6, the surface texture recognition device further comprises: a plurality of first electrode lines 80 arranged in parallel and a plurality of second electrode lines 90 arranged in parallel; the first electrode lines 80 and the second electrode lines 90 are intersected and insulated from each other; the first electrode lines 80 and the second electrode lines 90 are connected with the photosensitive detectors 30, respectively. For example, the first electrode of each of the photosensitive detectors 30 is connected with one of the first electrode lines 80, and the second electrode of each of the photosensitive detectors 30 is connected with one of the first electrode lines 80.

Here, signals are inputted to the first electrode lines 80 row by row, when a signal is inputted to the first electrode line 80 in the first row, it can be determined that the portions, which are corresponding to a plurality of surface texture recognition sensors 01 in the first row, of the fingerprint to be respectively ridges or valleys through detecting the change of the signals on the plurality of second electrode lines 90; when a signals is inputted to the first electrode line 80 in the second row, it can be determined that the portions, which are corresponding to a plurality of surface texture recognition sensors 01 in the second row, of the fingerprint are respectively to be ridges or valleys through detecting the change of the signals on the plurality of second electrode lines 90; in the same way, the signals are inputted to the first electrode lines 80 row by row, so that the fingerprint information can be obtained.

Furthermore, for example, the surface texture recognition device further comprises a signal input unit and a processor unit; the signal input unit is used to input signals to the first electrode lines 80; the processor unit is used to detect the change of the signals on the second electrode lines 90 when the first electrode lines 80 are inputted with the signals, and to determine the portions, which is corresponding to the position where the surface texture recognition sensor 01 is located, of the fingerprint to be the ridge or the valley according to the change of the signal on the second electrode line 90, so as to obtain the fingerprint information.

If the signal on a second electrode line 90 is changed, the position where the surface texture recognition sensor 01 is located is corresponding to the ridge of the fingerprint; if the signal on the second electrode line 90 is not changed, the position where the surface texture recognition sensor 01 is located is corresponding to the valley of the fingerprint. On this basis, in the case where the signal on the second electrode line 90 is changed, the change may be from the case where no signal exists to the case where a signal exists; also the change may be from the case where a signal exists to the case where no signal exists.

In this embodiment of the present disclosure, after the signal input unit inputs a signal to a first electrode line 80, in the case where the finger is in contact with the surface texture recognition sensor 01, because the thermal energy of the ridge of the fingerprint of the finger can be conducted to the second dielectric layer 20, and cause the refractive index of the second dielectric layer 20 to be changed, and therefore, the propagation behavior of the light emitted by the light source 40 at the interface between the first dielectric layer 10 and the second dielectric layer 20 is affected, and the change of the detection result of the photosensitive detector 30 is caused; because the valley of the fingerprint of the finger is not in contact with the surface texture recognition sensor 01, the change of the detection result of the photosensitive detector 30 at the position corresponding to the valley is not caused. By this way, when detecting the second electrode lines 90, the signals on the second electrode lines 90 connected to the surface texture recognition sensors 01 corresponding to the ridges of the fingerprint are changed, the signals on the second electrode lines 90 connected to the surface texture recognition sensors 01 corresponding to the valleys of the fingerprint are not changed, and therefore, it can be determined that the position where the surface texture recognition sensor 01 is located is the ridge of the fingerprint or the valley of the fingerprint according to whether or not the signal on the second electrode line 90 is changed, such that the fingerprint information is obtained.

The embodiments of the present disclosure provide a display device, which comprises any one of the above-mentioned surface texture recognition devices.

Here, the surface texture recognition device may be arranged at the display region of the display device; the surface texture recognition device may also be arranged at the non-display region of display device, the surface texture recognition device, for example, is arranged at the back surface (that is, the surface which is opposite to the display surface) of the display device. In the case where the surface texture recognition device is arranged in the display region of the display device, those skilled in the art should understand that the surface texture recognition device should not affect the normal light emission of the display device, and therefore, the surface texture recognition sensor 01 should not be provided with the light-shielding layer 70 or the material of the thermal conductive layer 60 should not be a light shielding material, optionally, the photosensitive detector 30 is allowed to be used to detect light with a certain wavelength, so as to realize fingerprint recognition.

The display device may be a liquid crystal display device, the display device may also be an organic electroluminescent display device, and no specific limitation will be given in this respect.

On this basis, the display device provided by an embodiment of the present disclosure may be any device that is able to display images containing text or drawings, in which the images may be in motion (for example, a video) or stationary (for example, static images). More specifically, it is expected that the embodiment can be implemented in a variety of electronic devices or can be related to a variety of electronic devices. The variety of electronic devices are, for example (but not limited to), mobile phones, wireless devices, personal data assistants (PDAs), handheld or portable computers, GPS receivers/navigators, cameras, MP4 video players, video cameras, game consoles, watches, clocks, calculators, TV monitors, flat panel displays, computer monitors, car displays (for example, displays for odometer, etc.), navigators, cockpit controllers and/or displays, displays for camera images (for example, displays for rear-view camera in vehicle), electronic photos, electronic billboards or destination board, projectors, building structures, packaging and aesthetic structures (for example, displays for display the images of a jewelry), and so on. In addition, the display device may also be a display panel.

An embodiment of the present disclosure provides a display device, because the display device comprises the surface texture recognition device, in the case where a finger is in contact with the surface texture recognition sensor 01, the thermal energy of the ridge of the fingerprint of the finger can be conducted to the first dielectric layer 10 and/or the second dielectric layer 20, and can cause the change of the refractive index of the first dielectric layer 10 and/or the refractive index of the second dielectric layer 20, the change of the refractive index of the first dielectric layer 10 and/or the refractive index of the second dielectric layer 20 causes the total reflection condition of the light emitted by the light source 40 at the interface between the first dielectric layer 10 and the second dielectric layer 20 to be changed, and therefore causes the detection result of the photosensitive detector 30 to be changed (light illumination is not detected before the touching of the finger and light illumination is detected after the touching of the fingerprint of the finger, or light illumination is detected before the touching of the finger and light illumination is not detected after the touching of the fingerprint of the finger). Because the valley of the fingerprint of the finger is not in contact with the surface texture recognition sensor 01, the change of the refractive index of the first dielectric layer 10 and/or the refractive index of the second dielectric layer 20 at a corresponding position is not caused, the total reflection condition of the light at the position, which is corresponding to the valley of the fingerprint of the finger, of the interface between the first dielectric layer 10 and the second dielectric layer 20 may not change, and therefore, the detection result of the photosensitive detector 30 may not change. It can be determined that the position where the surface texture recognition sensor 01 is located is corresponding to the ridge of the fingerprint or the valley of the fingerprint according to the detection result of the photosensitive detector 30, and fingerprint information may be obtained through detection of the plurality of surface texture recognition sensors 01, such that fingerprint recognition is realized.

The embodiments of the present disclosure further provides a surface texture recognition method for the surface texture recognition device, as illustrated in FIG. 7, the surface texture recognition method comprises the following steps.

S100: determining the portion, which is corresponding to the position where the surface texture recognition sensor 01 is located, of the fingerprint to be the ridge or the valley according to whether or not the light, which is emitted by the light source 40 and detected by the photosensitive detector 30, passes through the interface between the first dielectric layer and the second dielectric layer 20 and is incident on the photosensitive detector 30, so as to obtain the fingerprint information.

In the case where, the fingerprint of a finger is not in contact with the surface texture recognition sensor 01, after the light emitted by the light source 40 is incident into the first dielectric layer 10, the total reflection of the light, which is emitted by the light source 40 and is incident into the first dielectric layer 10, occurs at the interface between the first dielectric layer 10 and the second dielectric layer 20; the refractive index of the second dielectric layer 20 is increased and/or the refractive index of the first dielectric layer 10 is decreased when the fingerprint of the finger is in contact with the surface texture recognition sensor 01, the refraction and reflection of the light emitted by the light source 40 occurs at the interface between the first dielectric layer 10 and the second dielectric layer 20. In the case where the fingerprint of the finger is not in contact with the surface texture recognition sensor 01, because the total reflection of the light, which is emitted by the light source 40 and is incident into the first dielectric layer 10, occurs at the interface between the first dielectric layer 10 and the second dielectric layer 20 after the light emitted by the light source 40 is incident into the first dielectric layer 10, the light emitted by the light source 40 cannot pass through the second dielectric layer 20, and cannot be incident on the photosensitive detector 30, and therefore, the photosensitive detector 30 detects no light illumination; in the case where the ridge of the fingerprint of the finger is in contact with the surface texture recognition sensor 01, the refractive index of the second dielectric layer 20 is increased and/or the refractive index of the first dielectric layer 10 is decreased, after the light emitted by the light source 40 is incident into the first dielectric layer 10, the reflection and refraction of the light, which is emitted by the light source 40 and is incident into the first dielectric layer 10, occurs at corresponding positions of the interface between the first dielectric layer 10 and the second dielectric layer 20, and therefore, the light emitted by the light source 40 can pass through the second dielectric layer 20 and be incident on the photosensitive detector 30, and the photosensitive detector 30 can detect light illumination. The ridge and the valley of the fingerprint can be determined according to whether or not the photosensitive detector 30 detects light illumination.

In the case where the fingerprint of a finger is not in contact with the surface texture recognition sensor, after the light emitted by the light source 40 is incident into the first dielectric layer 10, the reflection and refraction of the light, which is emitted by the light source 40 and is incident into the first dielectric layer 10, occurs at the interface between the first dielectric layer 10 and the second dielectric layer 20; in the case where the fingerprint of the finger is in contact with the surface texture recognition sensor, the refractive index of the second dielectric layer 20 is decreased and/or the refractive index of the first dielectric layer 10 is increased, the total reflection of the light emitted by the light source 40 occurs at the interface between the first dielectric layer 10 and the second dielectric layer 20. In the case where the fingerprint of the finger is not in contact with the surface texture recognition sensor 01, because the reflection and refraction of the light, which is emitted by the light source 40 and is incident into the first dielectric layer 10, occurs at the interface between the first dielectric layer 10 and the second dielectric layer 20 after the light emitted by the light source 40 is incident into the first dielectric layer 10, the light emitted by the light source 40 can pass through the second dielectric layer 20 and be incident on the photosensitive detector 30, and therefore, the photosensitive detector 30 can detect light illumination; in the case where the ridge of the fingerprint of the finger is in contact with the surface texture recognition sensor 01, the refractive index of the second dielectric layer 20 is increased and/or the refractive index of the first dielectric layer 10 is decreased, after the light emitted by the light source 40 is incident into the first dielectric layer 10, the total reflection of the light, which is emitted by the light source 40 and is incident into the first dielectric layer 10, occurs at corresponding positions of the interface between the first dielectric layer 10 and the second dielectric layer 20, and therefore, the light emitted by the light source 40 cannot pass through the second dielectric layer 20 and cannot be incident on the photosensitive detector 30, and the photosensitive detector 30 detects no light illumination. The ridge and the valley of the fingerprint can be determined according to whether or not the photosensitive detector 30 detects light illumination.

Optionally, the surface texture recognition device further comprises: the plurality of first electrode lines 80 arranged in parallel, and the plurality of second electrode lines 90 arranged in parallel; the first electrode line 80 and the second electrode line 90 are intersected and insulated from each other, and the first electrode lines 80 and the second electrode lines 90 are connected to the photosensitive detectors 30, respectively.

The surface texture recognition method, for example, comprises: inputting signals to the first electrode lines 80 row by row, and sequentially detecting the change of the signals on the second electrode lines 90, determining the portions, which are corresponding to the positions where the photosensitive detectors 30 are located, of the fingerprint are ridges or the valleys, so as to obtain the fingerprint information.

Here, whether or not the signal on a second electrode line 90 is changed refers to the change from the case where a signal exists on the second electrode line 90 to the case where no signal exists on the second electrode line 90, or the change from the case where no signal exists on the second electrode line 90 to the case where a signal exists on the second electrode line 90

The signals are inputted to the first electrode lines 80 row by row, when a signal is inputted to the first electrode line 80 in the first row, it can be determined that the portions, which are corresponding to a plurality of surface texture recognition sensors 01 in the first row, of the fingerprint to be the ridges or the valleys of the fingerprint through detecting whether or not the signals on the plurality of second electrode lines 90 are changed; when a signal is inputted to the first electrode line 80 in the second row, it can be determined that the portions, which are corresponding to a plurality of surface texture recognition sensors 01 at the second row, of the fingerprint to be the ridges or the valleys of the fingerprint through detecting whether or not the signals on the plurality of second electrode lines 90 are changed; in the same way, the signals are inputted to the first electrode lines 80 row by row, so as to be able to obtain the fingerprint information.

In the embodiments of the present disclosure, after inputting signals to the first electrode lines 80 row by row, sequentially detecting the change of the signals on the second electrode lines 90, if the signal on a second electrode line 90 is changed, the position where the surface texture recognition sensor 01 is located is corresponding to the ridge of the fingerprint; if the signal on a second electrode line 90 is not changed, the position where the surface texture recognition sensor 01 is located is corresponding to the valley of the fingerprint.

What are described above is related to the illustrative embodiments of the disclosure only and not limitative to the scope of the disclosure; with the technical content disclosed by the present disclosure, those skilled in the art can easily envisage modifications or substitutions, which should be covered by the scope of the present disclosure. Therefore, the scopes of the disclosure are defined by the accompanying claims.

What is claimed is:

1. A surface texture recognition sensor, which is configured to recognize a ridge and a valley of a surface, the surface texture recognition sensor comprising:
   a first dielectric layer and a second dielectric layer which overlap with each other;
   a light source, which is configured to emit light into the first dielectric layer; and
   a photosensitive detector, which is at a side of the second dielectric layer away from the first dielectric layer, is used to detect whether or not the light emitted from the light source passes through an interface between the first dielectric layer and the second dielectric layer and is incident onto the photosensitive detector;
   wherein the light emitted from the light source is incident onto the interface with an incident angle; and
   with the surface texture recognition sensor being in contact with the surface, a refractive index of at least one of the first dielectric layer and the second dielectric layer is changed to allow a critical angle of total reflection to be changed according to one of following ways:
   from being smaller than the incident angle to being larger than the incident angle; and
   from being larger than the incident angle to being smaller than the incident angle, wherein the surface texture recognition sensor further comprises a thermal conductive layer at a side of the photosensitive detector away from the second dielectric layer; and the thermal conductive layer is in contact with the first dielectric layer and/or the second dielectric layer.

2. The surface texture recognition sensor according to claim 1, wherein with the surface texture recognition sensor being in contact with the surface, changing of the refractive index of the at least one of the first dielectric layer and the second dielectric layer to allow the critical angle to be changed from the angle smaller than the incident angle to the angle larger than the incident angle comprises:

with the surface texture recognition sensor being in contact with the surface, the refractive index of the second dielectric layer is increased and/or the refractive index of the first dielectric layer is decreased to allow the critical angle to be changed from being smaller than the incident angle into being larger than the incident angle.

3. The surface texture recognition sensor according to claim 1, wherein with the surface texture recognition sensor being in contact with the surface, changing of the refractive index of the at least one of the first dielectric layer and the second dielectric layer to allow the critical angle to be changed from the angle larger than the incident angle into the angle smaller than the incident angle comprises:

with the surface texture recognition sensor being in contact with the surface, the refractive index of the second dielectric layer is decreased and/or the refractive index of the first dielectric layer is increased to allow the critical angle to be changed from being larger than the incident angle to being smaller than the incident angle.

4. The surface texture recognition sensor according to claim 1, wherein the photosensitive detector comprises a switch unit; and the switch unit is configured to be in a turn-on state if the switch unit is illuminated by the light emitted by the light source, and to be in a turn-off state if the switch unit is not illuminated by the light emitted by the light source.

5. The surface texture recognition sensor according to claim 4, wherein the switch unit comprises a first electrode, a second electrode, and a semiconductor layer which is in contact with both of the first electrode and the second electrode, and the first electrode and the second electrode are insulated from each other.

6. The surface texture recognition sensor according to claim 1, wherein the light emitted by the light source is invisible light.

7. The surface texture recognition sensor according to claim 1, wherein the surface texture recognition sensor further comprises a light-shielding layer which covers the photosensitive detector.

8. The surface texture recognition sensor according to claim 1, wherein a material of the thermal conductive layer is a light shielding material.

9. The surface texture recognition sensor according to claim 1, wherein the refractive index of the at least one of the first dielectric layer and the second dielectric layer is changed along with a change in temperature.

10. A surface texture recognition device, comprising a plurality of surface texture recognition sensors, wherein each of the plurality of surface is configured to recognize a ridge and a valley of a surface, and comprises:

a first dielectric layer and a second dielectric layer which overlap with each other;

a light source, which is configured to emit light into the first dielectric layer; and a photosensitive detector, which is at a side of the second dielectric layer away from the first dielectric layer, is used to detect whether or not the light emitted from the light source passes through an interface between the first dielectric layer and the second dielectric layer and is incident onto the photosensitive detector;

wherein the light emitted from the light source is incident onto the interface with an incident angle; and with the recognition unit being in contact with the surface, a refractive index of at least one of the first dielectric layer and the second dielectric layer is changed to allow a critical angle of total reflection to be changed according to one of the following ways:

from being smaller than the incident angle to being larger than the incident angle; and from being larger than the incident angle to being smaller than the incident angle;

wherein the surface texture recognition sensor further comprises a thermal conductive layer at a side of the photosensitive detector away from the second dielectric layer; and the thermal conductive layer is in contact with the first dielectric layer and/or the second dielectric layer.

11. The surface texture recognition device according to claim 10, wherein the surface texture recognition device further comprises: a plurality of first electrode lines arranged in parallel and a plurality of second electrode lines arranged in parallel; and the plurality of first electrode lines and the plurality of second electrode lines are intersected and insulated from each other, and each of the photosensitive detectors is connected with one of the first electrode lines and with one of the second electrode lines.

12. The surface texture recognition device according to claim 11, wherein the surface texture recognition device further comprises a signal input unit and a processor unit, the signal input unit is configured to input signals to the plurality of first electrode lines; and the processor unit is configured to detect output signals on the plurality of second electrode lines which intersect the first electrode lines, in a case where the first electrode lines are inputted with input signals, and to determine portions of the surface corresponding to positions of the surface texture recognition sensors to be ridges or valleys according to the output signals on the plurality of second electrode lines, so as to obtain texture information of the surface.

13. A display device, comprising a surface texture recognition device, wherein the surface texture recognition device comprises a plurality of surface texture recognition sensors, each of the plurality of surface is configured to recognize a ridge and a valley of the surface, and comprises:

a first dielectric layer and a second dielectric layer which overlap with each other;

a light source, which is configured to emit light into the first dielectric layer; and a photosensitive detector, which is at a side of the second dielectric layer away from the first dielectric layer, is used to detect whether or not the light emitted from the light source passes through an interface between the first dielectric layer and the second dielectric layer and is incident onto the photosensitive detector;

wherein the light emitted from the light source is incident onto the interface with an incident angle; and with the surface texture recognition sensor being in contact with the surface, a refractive index of at least one of the first dielectric layer and the second dielectric layer is changed to allow a critical angle of total reflection to be changed according to one of following ways:

from being smaller than the incident angle to being larger than the incident angle; and from being larger than the incident angle to being smaller than the incident angle;

wherein the surface texture recognition sensor further comprises a thermal conductive layer at a side of the photosensitive detector away from the second dielectric layer; and the thermal conductive layer is in contact with the first dielectric layer and/or the second dielectric layer.

14. A surface texture recognition method of the surface texture recognition device according to claim 10, comprising:

determining a portion, which is corresponding to a position where each of the surface texture recognition sensors is located, of the surface to be the ridge or the valley according to whether or not light, which is emitted by the light source and detected by the photosensitive detector, passes through the interface between the first dielectric layer and the second dielectric layer and is incident onto the photosensitive detector, so as to obtain texture information of the surface.

15. The surface texture recognition method according to claim 14, wherein the surface texture recognition device further comprises: a plurality of first electrode lines arranged in parallel and a plurality of second electrode lines arranged in parallel;

the first electrode lines and the second electrode lines are intersected are insulated from each other, the first electrode lines and the second electrode lines are connected with the photosensitive detectors, respectively;

the surface texture recognition method comprises:

inputting input signals to the plurality of first electrode lines row by row;

sequentially detecting output signals on the plurality of second electrode lines; and determining the portion, which is corresponding to the position where each of the photosensitive detectors is located, of the surface to be the ridge or the valley according to the output signals, so as to obtain the texture information of the surface.

\* \* \* \* \*